United States Patent [19]
Chou

[11] Patent Number: 5,985,725
[45] Date of Patent: Nov. 16, 1999

[54] METHOD FOR MANUFACTURING DUAL GATE OXIDE LAYER

[75] Inventor: Jih-Wen Chou, Hsinchu, Taiwan

[73] Assignee: United Microelectronics Corp., Taiwan

[21] Appl. No.: 08/997,449

[22] Filed: Dec. 23, 1997

[30] Foreign Application Priority Data

Oct. 18, 1997 [TW] Taiwan .................................. 86115358

[51] Int. Cl.$^6$ .......................... H01L 21/336; H01L 21/31; H01L 21/469
[52] U.S. Cl. ............................................. 438/294; 438/762
[58] Field of Search ............................ 438/121, 89, 168, 438/192, 125, 312, 294, 762

[56] References Cited

U.S. PATENT DOCUMENTS

| | | |
|---|---|---|
| 5,378,645 | 1/1995 | Inoue et al. . |
| 5,502,009 | 3/1996 | Lin . |
| 5,731,238 | 3/1998 | Cavins et al. . |
| 5,863,819 | 1/1999 | Gonzalez . |

OTHER PUBLICATIONS

Wolf, S and Tauber, R.N., Silicon Processing for the VLSI Era, vol. 1 and 2, Lattice Press, vol. 1, pp. 534, 539; vol. 2 p. 45, 1986.

*Primary Examiner*—John F. Niebling
*Assistant Examiner*—Josetta Jones
*Attorney, Agent, or Firm*—Rabin & Champagne, P.C.

[57] ABSTRACT

A method for forming a dual gate oxide layer, which can be suitably applied to the surface of a shallow trench isolation structure, comprising the steps of providing a substrate that has a device isolation structure already formed thereon such as a shallow trench isolation. Next, a thermal oxidation process is carried out to form an oxide layer over the substrate and the isolation structure. A silicon nitride layer is then deposited on top of the oxide layer. In the subsequent step, the silicon nitride layer is patterned to cover portions of the oxide layer that lies in an input/output area. The method of this invention produces a better quality gate oxide layer over the device isolation structure and the substrate surface. Therefore, device problems caused by the deposition of a poor quality gate oxide in a conventional method can be greatly reduced.

12 Claims, 4 Drawing Sheets

METHOD FOR MANUFACTURING DUAL GATE OXIDE LAYER

BACKGROUND OF THE INVENTION

1. Field of Invention

The present invention relates to a method for manufacturing semiconductor devices. More particularly, the present invention relates to a method for manufacturing a dual gate oxide layer.

2. Description of Related Art

Integrated circuits are generally constructed from a combination of different devices and isolating structures. The devices are separated from each other through the isolating structures. The most commonly employed isolating structures include shallow trench isolation (STI). For example, the shallow trench isolation separates an input/output (I/O) device area from a core device area. After the formation of an isolation structure, a gate oxide layer is normally formed over the substrate surface. This gate oxide layer serves to facilitate the subsequent formation of a gate or connecting lines. Since a larger voltage is required for controlling the devices in an input/output area compared to a core device area, the input/output area must have a thicker gate oxide layer. Therefore, a thicker gate oxide layer must be formed in the input/output area to protect the devices against any adverse effects caused by a high operating voltage.

FIGS. 1A through 1D are cross-sectional views showing the progression of manufacturing steps in the formation of a dual oxide gate layer according a conventional method. First, as shown in FIG. 1A, a pad oxide layer 11 and a silicon nitride layer 12 are sequentially formed over a substrate 10. Then, photolithographic and etching processes are used to pattern the pad oxide layer 11 and the silicon nitride layer 12. Next, the substrate 10 is etched to form an opening 13 serving as a STI trench, wherein a liner oxide layer 14 can be formed on the bottom and sidewalls of the trench. Thereafter, using a chemical vapor deposition (CVD) method, an oxide layer is deposited into the trench. This is followed by a back etching operation using a chemical-mechanical polishing (CMP) method. Subsequently, the silicon nitride layer 12 is removed. Then, using hydrofluoric acid solution, the pad oxide layer 11 is also removed to form the block of oxide 15 as shown in FIG. 1B. Next, an oxide layer is formed over the substrate 10 and the surface of the oxide block 15 using a thermal oxidation process. A pattern of the input/output area is then defined on the oxide layer, and etched to form a first gate oxide layer 16. A second gate oxide layer 17 is then formed over the first gate oxide layer 16, the oxide block 15 and the substrate 10. Hence, a thicker gate oxide layer is formed above the I/O area, while a thinner gate oxide layer is formed over the core device area as shown in FIG. 1C. Finally, as shown in FIG. 1D, conventional techniques are used to form gates 18 on top of the I/O device and the core device.

In a conventional device manufacturing method, hydrofluoric acid is used to remove the pad oxide layer 11. Due to the isotropic etching of hydrofluoric acid in a wet etching process, recesses will form at the junction between the oxide block 15 and the gate surface 10. Recesses in the junction will lead to the occurrence of a kink effect. The kink effect caused by over-etching will lead not only to a lowering of the threshold voltage, but will also lead to an inferior quality for the subsequently deposited gate oxide layer and a lower device yield.

In light of the foregoing, there is a need in the art to provide a better method for manufacturing a dual gate oxide layer.

SUMMARY OF THE INVENTION

Accordingly, since it is difficult to avoid over-etching of the isolating structure when the pad layer is removed using a hydrofluoric acid, the present invention is directed to provide a method for forming a dual gate oxide layer that uses slightly different processing steps and material from the conventional method. This serves to improve the quality of the ultimately formed gate oxide layer, and prevent defects happening to the device due to the gate oxide deposition.

To achieve these and other advantages and in accordance with the purpose of the invention, as embodied and broadly described herein, the invention provides a method for forming a dual gate oxide layer, which can be suitably applied to the surface of a STI structure, comprising providing a substrate that has a device isolation structure already formed thereon such as a shallow trench isolation. Next, a thermal oxidation process is carried out to form an oxide layer over the substrate and the isolation structure. A silicon nitride layer is then deposited on top of the oxide layer. In the subsequent step, the silicon nitride layer is patterned to cover portions of the oxide layer that lies in an input/output area. Therefore, the input/output area is covered on top by a gate oxide layer that composed of an oxide layer and a silicon nitride layer, while the core devices are covered on top by a gate oxide layer that composed of an oxide layer only. Hence, the input/output area has a thicker gate oxide layer, and the core device area has a thinner gate oxide layer. Furthermore, the quality of the gate oxide layer formed using this method is better than the conventional. Finally, subsequent processes necessary for the completion of the gate device in an integrated circuit is performed.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
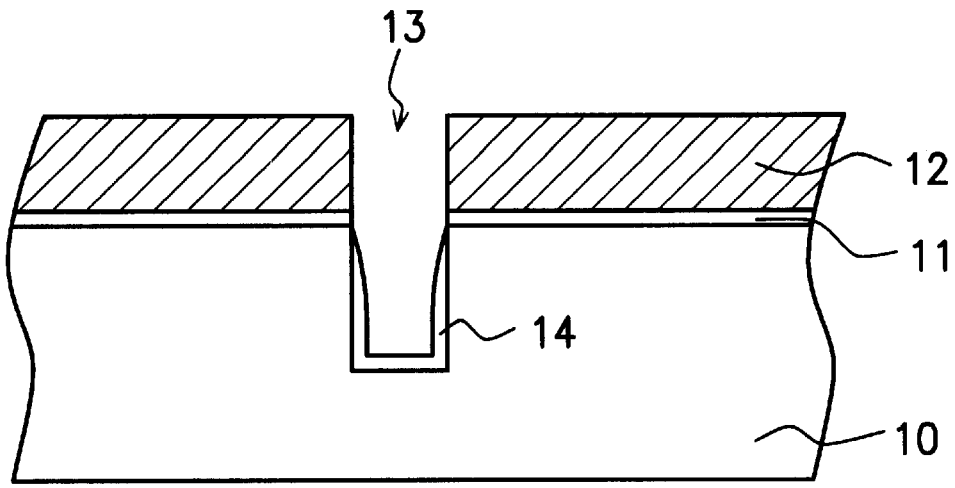
FIGS. 1A through 1D are cross-sectional views showing the progression of manufacturing steps in the formation of a dual oxide gate layer according a conventional method.
Figure 1B:
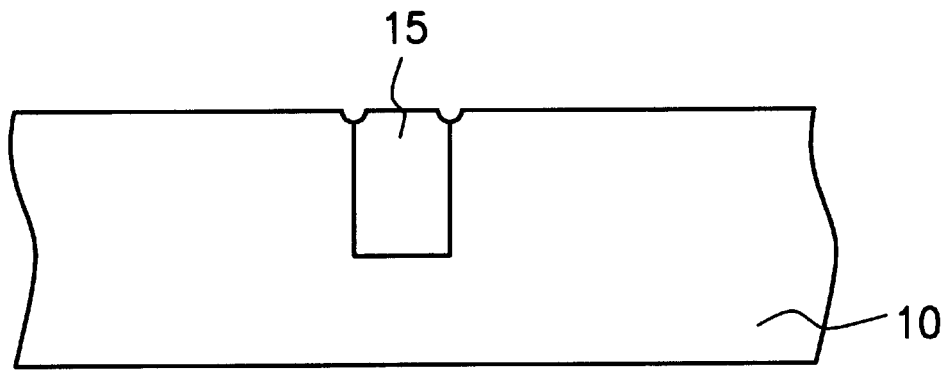
Figure 1C:
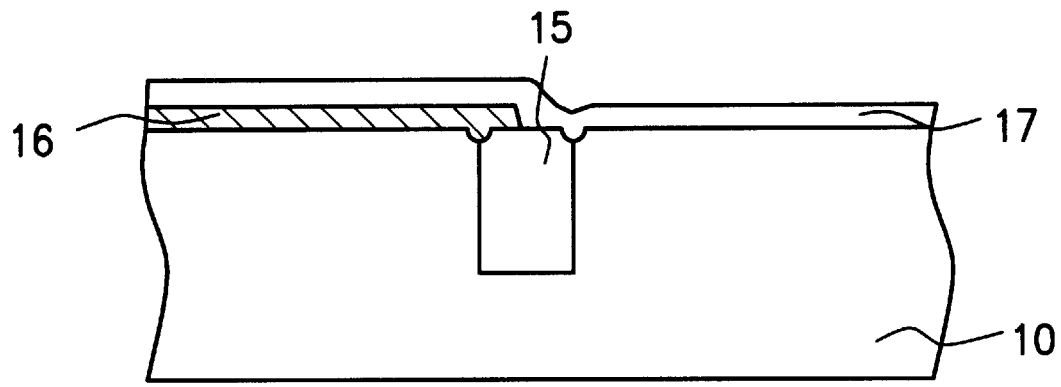
Figure 1D:
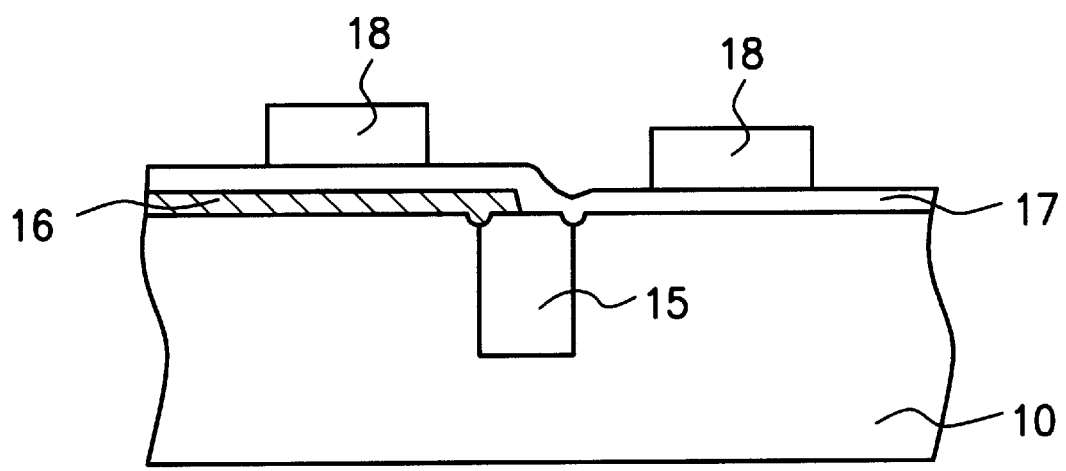

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2E are cross-sectional views showing the progression of manufacturing steps in the formation of a dual oxide gate layer according one preferred embodiment of the invention.

Figure 2A:
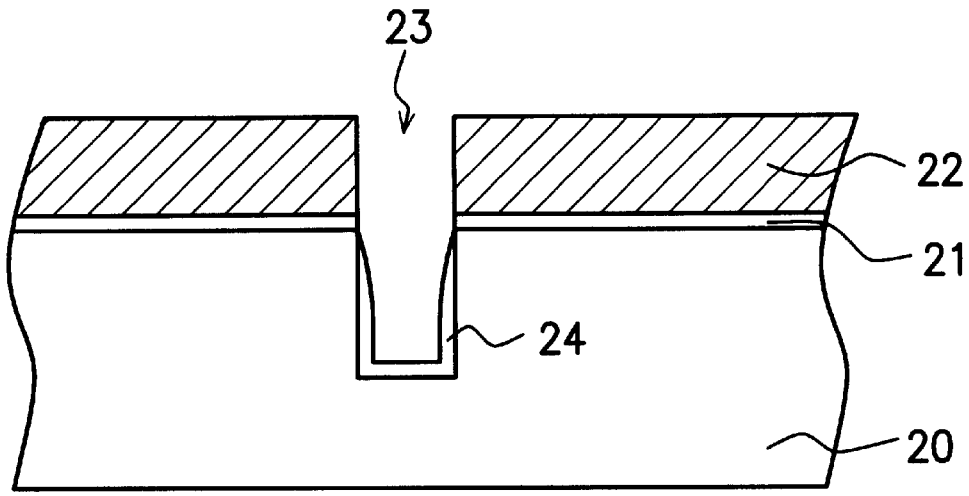
FIGS. 2A through 2E are cross-sectional views showing the progression of manufacturing steps in the formation of a dual oxide gate layer according one preferred embodiment of the invention.

First, as shown in FIG. 2A, a device isolation structure such as shallow trench isolation is formed over a substrate 20. The isolation structure is formed by sequentially forming a pad oxide layer 21 and a silicon nitride layer 22 above a substrate 20. The pad oxide layer 21 can be formed, for example, using a thermal oxidation method. Then, the silicon nitride layer 22 and the pad oxide layer 21 are patterned using photolithographic and etching processes. Subsequently, the substrate is also etched to form a trench 23, which serves as the trench structure for the STI, using the silicon nitride layer 22 as a mask. The etching operation can be conducted using a plasma etching method; furthermore, a liner oxide layer 24 can be formed on the trench bottom and sidewalls afterwards.

Figure 2B:
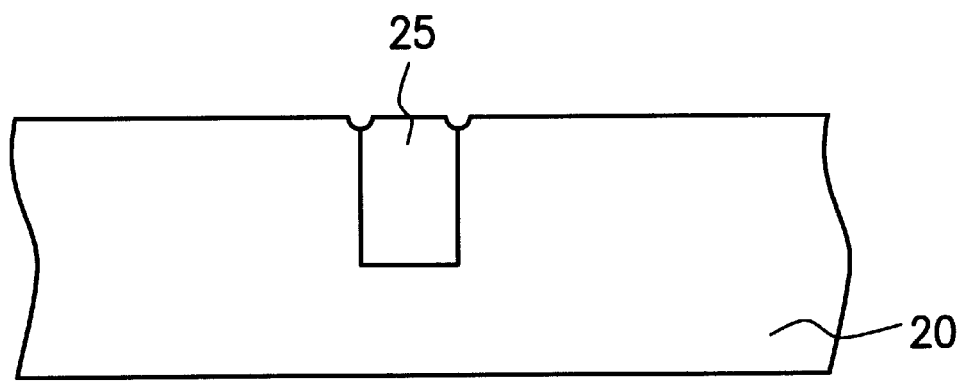

Next, as shown in FIG. 2B, an oxide layer is deposited into the trench 23, and then etched back using a chemical-mechanical polishing method to form an oxide block 25. Thereafter, the silicon nitride layer 22 and the pad oxide layer 21 are removed to form device isolation structure. The silicon nitride layer 22 can be removed using a wet etching employing hot phosphoric acid or using a plasma etching method. The pad oxide layer 21 can be removed using hydrofluoric acid solution.

Figure 2C:
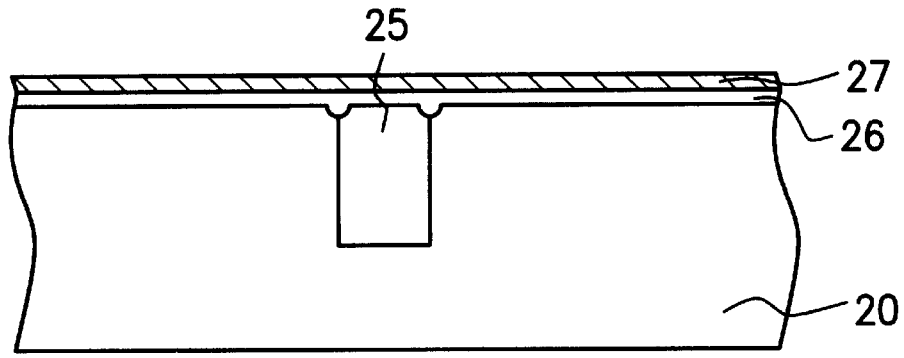

Next, as shown in FIG. 2C, an oxide layer 26 is formed over the device isolation structure and the substrate 20. A silicon nitride layer 27 is then formed over the oxide layer 26. The oxide layer 26 can be formed, for example, using a thermal oxidation method. The silicon nitride layer 27 can be formed, for example, using a chemical vapor deposition (CVD) method, or preferably a jet vapor deposition method to obtain a better quality silicon nitride layer.

Figure 2D:
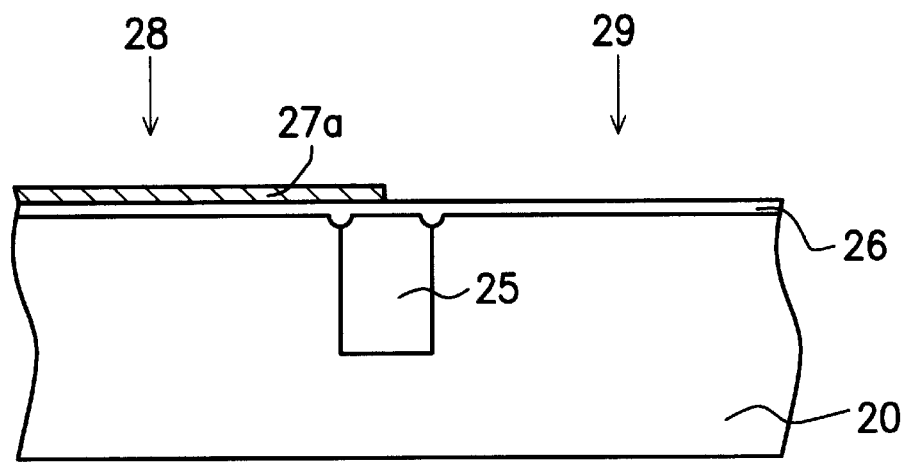

Next, as shown in FIG. 2D, photolithographic and etching processes are used to define a pattern on the silicon nitride layer 27 over the area where the input/output devices are located. Then, the silicon nitride layer over the core device area is removed by etching, forming a silicon nitride layer 27a over the input/output device area. The silicon nitride layer can be etched, for example, using a wet etching method employing hot phosphoric acid solution. Therefore, the gate oxide layer of the input/output device area 28 is composed of an oxide layer 26 and a silicon nitride layer 27a. On the other hand, the gate oxide layer of the care device area 29 is composed of the oxide layer 26 only. Consequently, the I/O device area has a thicker gate oxide layer, and the core device area 29 has a rather thin gate oxide layer.

Figure 2E:
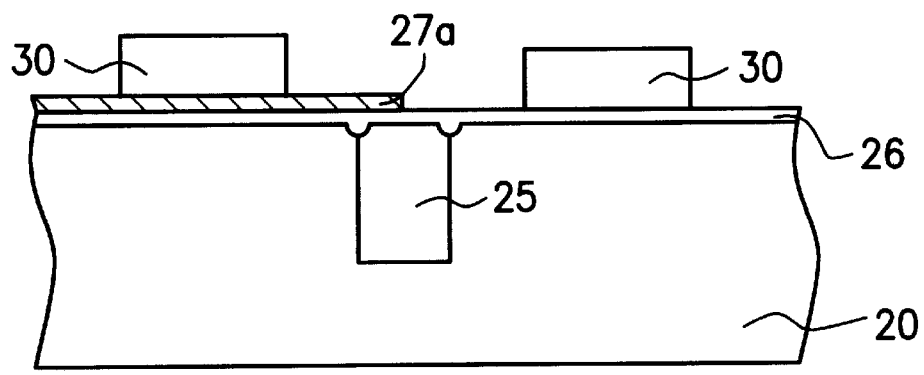

Finally, as shown in FIG. 2E, conventional processes are used to form gates 30 on top of the silicon nitride layer 27a in the defined input/output device area 28 and the oxide layer 26 in the defined core device area 29.

The method of this invention produces a better quality gate oxide layer over the device isolation structure and the substrate surface. Therefore, device problems caused by the deposition of a poor quality gate oxide in a conventional method can be greatly reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing a dual gate oxide layer, comprising the steps of:

providing a substrate that has a device isolation structure already formed thereon;

forming an oxide layer over the substrate and the device isolation structure;

forming a silicon nitride layer over the oxide layer; and patterning the silicon nitride layer so that portions of the oxide layer are covered by the silicon nitride layer and portions of the oxide layer are exposed, wherein the oxide layer covered by a silicon nitride layer defines an input/output device area, whereas the oxide layer not covered by a silicon nitride layer defines a core device area, wherein the patterning of the silicon nitride layer further includes:
   defining the silicon nitride layer covered input/output device area as a first gate oxide layer; and
   defining the silicon nitride layer-free core device area as a second gate oxide layer, and wherein the first gate oxide layer includes a silicon nitride/oxide stack.

2. The method of claim 1, wherein the device isolation structure that is formed in the substrate is a shallow trench isolation.

3. The method of claim 1, wherein the step of forming the oxide layer includes using a thermal oxidation method.

4. The method of claim 1, wherein the step of forming the silicon nitride layer includes using a jet deposition method.

5. The method of claim 1, wherein the step of patterning the silicon nitride layer includes etching away a portion of the silicon nitride layer.

6. The method of claim 5, wherein the step of etching the silicon nitride layer includes using hot phosphoric acid.

7. The method of claim 1, wherein the second gate oxide layer is an oxide layer.

8. The method of claim 1, wherein the first gate oxide layer is thicker than the second gate oxide layer.

9. The method of claim 1, further comprising forming a first gate on top of the silicon nitride of the silicon nitride/oxide stack.

10. The method of claim 9, further comprising forming a second gate on top of the oxide layer in the core device area.

11. The method of claim 10, wherein the silicon nitride layer is in direct contact with the oxide layer in the input/output device area.

12. The method of claim 10, wherein the first gate is formed in direct contact with the silicon nitride of the silicon nitride/oxide stack, and the second gate is formed in direct contact with the oxide layer in the core device area.

* * * * *